(12) United States Patent
Kim et al.

(10) Patent No.: US 11,055,011 B2
(45) Date of Patent: Jul. 6, 2021

(54) STORAGE DEVICE

(71) Applicant: SAMSUNG ELECTRONICS CO., LTD., Suwon-si (KR)

(72) Inventors: Hee Sung Kim, Seoul (KR); Hyun Wook Shin, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/799,360

(22) Filed: Feb. 24, 2020

(65) Prior Publication Data

US 2021/0042052 A1 Feb. 11, 2021

(30) Foreign Application Priority Data

Aug. 7, 2019 (KR) .................. 10-2019-0095826

(51) Int. Cl.
| | |
|---|---|
| *G11C 16/04* | (2006.01) |
| *G06F 3/06* | (2006.01) |
| *G06F 13/16* | (2006.01) |
| *G11C 11/00* | (2006.01) |
| *G11C 13/00* | (2006.01) |
| *G11C 16/26* | (2006.01) |
| *G11C 11/56* | (2006.01) |
| *G11C 16/10* | (2006.01) |

(52) U.S. Cl.
CPC .......... *G06F 3/0647* (2013.01); *G06F 3/0604* (2013.01); *G06F 3/068* (2013.01); *G06F 3/0659* (2013.01); *G06F 13/1668* (2013.01); *G11C 11/005* (2013.01); *G11C 11/5671* (2013.01); *G11C 13/0004* (2013.01); *G11C 13/004* (2013.01); *G11C 13/0069* (2013.01); *G11C 16/0483* (2013.01); *G11C 16/10* (2013.01); *G11C 16/26* (2013.01); *G11C 2213/79* (2013.01)

(58) Field of Classification Search
CPC .................................. G11C 16/0483
USPC ..................................... 365/185.17
See application file for complete search history.

(56) References Cited

U.S. PATENT DOCUMENTS

| | | |
|---|---|---|
| 7,873,778 B2 | 1/2011 | Choi et al. |
| 8,041,879 B2 | 10/2011 | Erez |
| 8,132,045 B2 | 3/2012 | Avila et al. |
| 8,423,700 B2 | 4/2013 | Panabaker et al. |
| 8,537,618 B2 | 9/2013 | Grossman et al. |

(Continued)

FOREIGN PATENT DOCUMENTS

| | | |
|---|---|---|
| JP | 2010-198252 A | 9/2010 |
| JP | 2010-231699 A | 10/2010 |

*Primary Examiner* — Jason Lappas
(74) *Attorney, Agent, or Firm* — Sughrue Mion, PLLC

(57) ABSTRACT

A storage device includes a first nonvolatile memory device, a second nonvolatile memory device, and a data line. The second nonvolatile memory device is of a different type from the first nonvolatile memory device. The data line is shared by the first nonvolatile memory device and the second nonvolatile memory device. First data is simultaneously provided to the first nonvolatile memory device and the second nonvolatile memory device through the data line, the first data is written to the second nonvolatile memory device, and the first data is reprogrammed into the first nonvolatile memory device by reading the first data from the second nonvolatile memory device and providing the read first data to the first nonvolatile memory device.

20 Claims, 11 Drawing Sheets

(56) References Cited

U.S. PATENT DOCUMENTS

| | | |
|---|---|---|
| 8,880,777 B2 | 11/2014 | Kim et al. |
| 9,952,784 B2 | 4/2018 | Sathyanaratan et al. |
| 2016/0071590 A1* | 3/2016 | Hsu .................... G11C 14/0018 365/185.08 |

* cited by examiner

FIG. 5
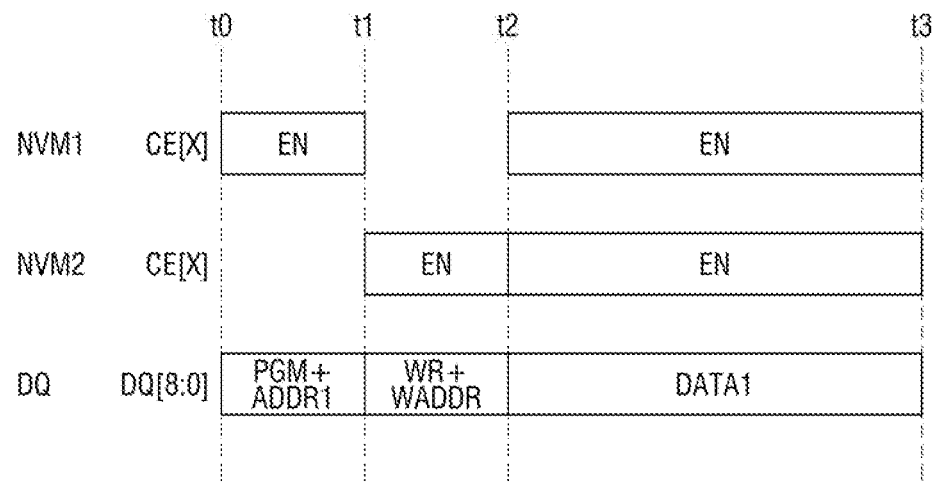
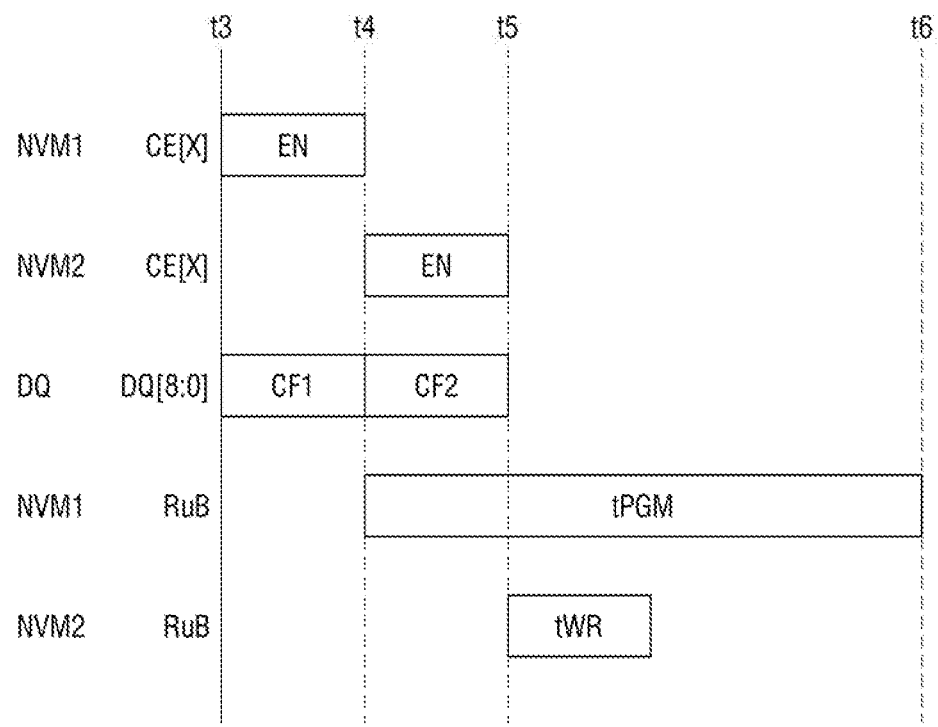

STORAGE DEVICE

This application claims priority from Korean Patent Application No. 10-2019-0095826, filed on Aug. 7, 2019, in the Korean Intellectual Property Office, the disclosure of which is incorporated by reference herein in its entirety.

BACKGROUND

1. Field

The present disclosure relates to a storage device.

2. Description of the Related Art

A flash memory is a nonvolatile memory that can retain stored data even when power supply is interrupted. Recently, storage devices including flash memories such as embedded multimedia cards (eMMCs), universal flash storage (UFS), solid state drives (SSDs), and memory cards are widely used. Storage devices are useful for storing or moving large amounts of data.

A nonvolatile memory device employing a reprogram method stores program data in a buffer memory, initially programs the stored program data, and reprograms the stored program data. That is, the buffer memory must store the program data until the end of the initial programming and reprogramming of the program data. Therefore, the reprogram method increases the time during which the buffer memory is occupied by the program data, which reduces the utilization of the buffer memory. Since the buffer memory is typically an expensive static random access memory (SRAM), the reduced utilization of the buffer memory may reduce the price competitiveness of the entire storage device.

SUMMARY

It is an aspect to provide a storage device capable of improving utilization of a buffer memory.

According to an aspect of an embodiment, there is provided a storage device comprising a first nonvolatile memory device, a second nonvolatile memory device which is of a different type from the first nonvolatile memory device, and a data line which is shared by the first nonvolatile memory device and the second nonvolatile memory device, wherein first data is simultaneously provided to the first nonvolatile memory device and the second nonvolatile memory device through the data line, the first data is written to the second nonvolatile memory device, and the first data is reprogrammed into the first nonvolatile memory device by reading the first data from the second nonvolatile memory device and providing the read first data to the first nonvolatile memory device.

According to another aspect of an embodiment, there is provided a storage device comprising a NAND flash memory device, a phase-change memory device, and a data line which is shared by the NAND flash memory device and the phase-change memory device, wherein first data is simultaneously provided to the NAND flash memory device and the phase-change memory device through the data line, and the first data is initially programmed into the NAND flash memory device while being written to the phase-change memory device, wherein an initial program period of the NAND flash memory device at least partially overlaps with a write period of the phase-change memory device.

According to another aspect of an embodiment, there is provided a storage device comprising a first nonvolatile memory device, a second nonvolatile memory device which is of a different type from the first nonvolatile memory device, a data line which is shared by the first nonvolatile memory device and the second nonvolatile memory device; and a buffer memory, wherein first data occupies a first region of the buffer memory, an occupation of the first region by the first data ends after the first data of the buffer memory is simultaneously provided to the first nonvolatile memory device and the second nonvolatile memory device through the data line, and the first data is written to the second nonvolatile memory device while being initially programmed into the first nonvolatile memory device.

According to another aspect of an embodiment, there is provided a storage device comprising a NAND flash memory device, a phase-change memory device, a data line which is shared by the NAND flash memory device and the phase-change memory device, and a buffer memory, wherein first data occupies a first region of the buffer memory, the occupation of the first region by the first data ends after the first data of the buffer memory is simultaneously provided to the NAND flash memory device and the phase-change memory device through the data line, the first data is written to the phase-change memory device while being initially programmed into the NAND flash memory device, and, if it is determined as a result of verification that the initial programming has failed, the first data is reprogrammed into the NAND flash memory device by reading the first data stored in the phase-change memory device and providing the read first data to the NAND flash memory device.

However, aspects of the present disclosure are not restricted to the aspects set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

These and/or other aspects will become apparent and more readily appreciated from the following description of the embodiments, taken in conjunction with the accompanying drawings in which:

FIG. 5 is a timing diagram for explaining operations S10 and S20 of the flowchart of FIG. 4;

DETAILED DESCRIPTION

Hereinafter, various embodiments will be described with reference to the attached drawings.

Figure 1:
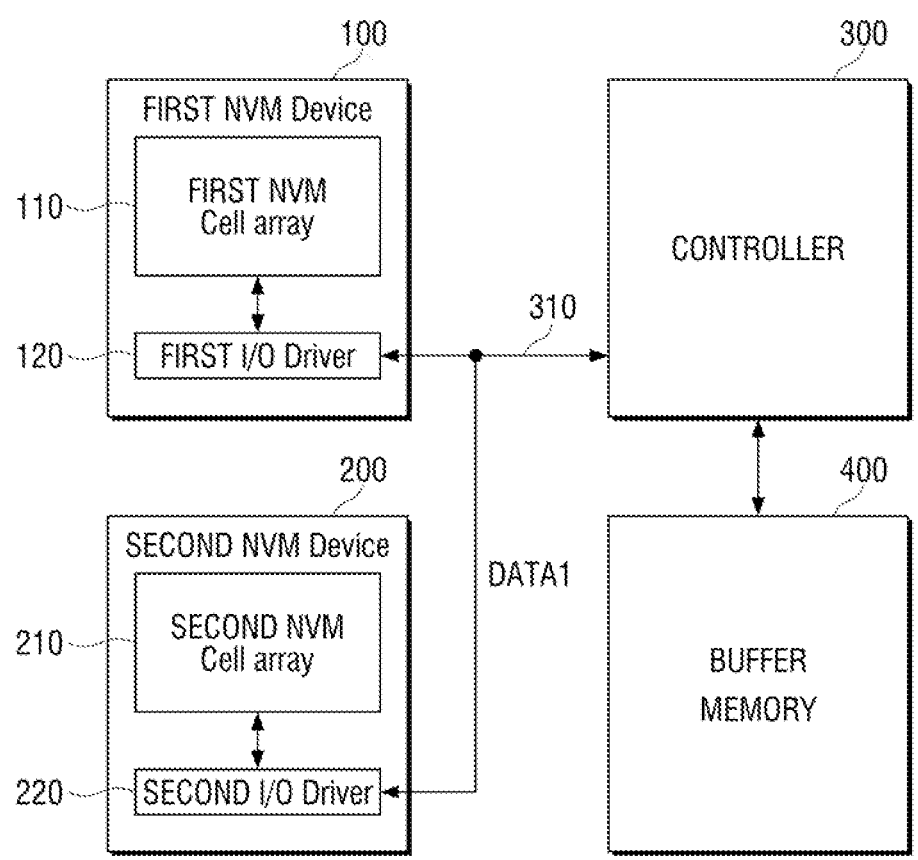
FIG. 1 is a block diagram of a storage device according to an embodiment.

FIG. 1 is a block diagram of a storage device according to an embodiment.

Referring to FIG. 1, a storage device includes a first nonvolatile memory (NVM) device 100, a second nonvolatile memory (NVM) device 200, a controller 300, and a buffer memory 400.

The first nonvolatile memory device 100 may be a main memory for storing data, and the second nonvolatile memory device 200 may be a backup memory for assisting in data storage of the first nonvolatile memory device 100. For example, the second nonvolatile memory device 200 may be used for recovery backup when a program error of the first nonvolatile memory device 100 occurs. Alternatively, the second nonvolatile memory device 200 may store data used for a reprogram operation of the first nonvolatile memory device 100, but embodiments are not limited to this case.

In some embodiments, the first nonvolatile memory device 100 and the second nonvolatile memory device 200 may be of different types. Here, a program time of the first nonvolatile memory device 100 may be longer than a write time of the second nonvolatile memory device 200. In addition, a read time of the first nonvolatile memory device 100 may be longer than a read time of the second nonvolatile memory device 200. For example, in some embodiments, the first nonvolatile memory device 100 may be a NAND memory device, and the second nonvolatile memory device 200 may be a phase-change memory device. Alternatively, in some embodiments, the first nonvolatile memory device 100 may be a flash memory device (e.g., a triple level cell (TLC) memory device or a quadruple level cell (QLC) memory device) that can store a plurality of bits in one memory cell, and the second nonvolatile memory device 200 may be a flash memory device (e.g., a single level cell (SLC) memory device) that can store one bit in one memory cell. That is, the first nonvolatile memory device 100 may have n-level memory cells (where n is a natural number), the second nonvolatile memory device 200 may have m-level memory cells (where m is a natural number), and n>m. The first and second nonvolatile memory devices 100 and 200 are not limited to the above examples.

For ease of description, the first nonvolatile memory device 100 is illustrated in FIG. 1 as including a first nonvolatile memory (NVM) cell array 110 including a plurality of first memory cells and a first input/output (I/O) driver 120. Likewise, the second nonvolatile memory device 200 is illustrated in FIG. 1 as including a second nonvolatile memory (NVM) cell array 210 including a plurality of second memory cells and a second input/output (I/O) driver 220. Specific internal functional blocks may vary depending on the type of the first nonvolatile memory device 100 and the type of the second nonvolatile memory device 200.

The buffer memory 400 may be implemented as, but is not limited to, a static random access memory (SRAM) or a dynamic random access memory (DRAM). A program/read time (speed) of the buffer memory 400 may be faster than a program/read time (speed) of the first nonvolatile memory device 100.

In particular, in the storage device according to the embodiment illustrated in FIG. 1, the first nonvolatile memory device 100 and the second nonvolatile memory device 200 may share a data line 310 with each other. Through the shared date line 310, data DATA1 may be simultaneously provided to the first nonvolatile memory device 100 and the second nonvolatile memory device 200. That is, a time required to provide the data DATA1 to the first and second nonvolatile memory devices 100 and 200 may be minimized.

In addition, the second nonvolatile memory device 200 may share an interface of the first nonvolatile memory device 100. Therefore, if the first nonvolatile memory device 100 is a NAND memory device and the second nonvolatile memory device 200 is a phase-change memory device, commands/addresses/data used to control the NAND flash memory device may also be used to control the phase-change memory device. A method of operating the storage device by using the shared data line 310 and the shared interface will be described in detail later.

Figure 2:
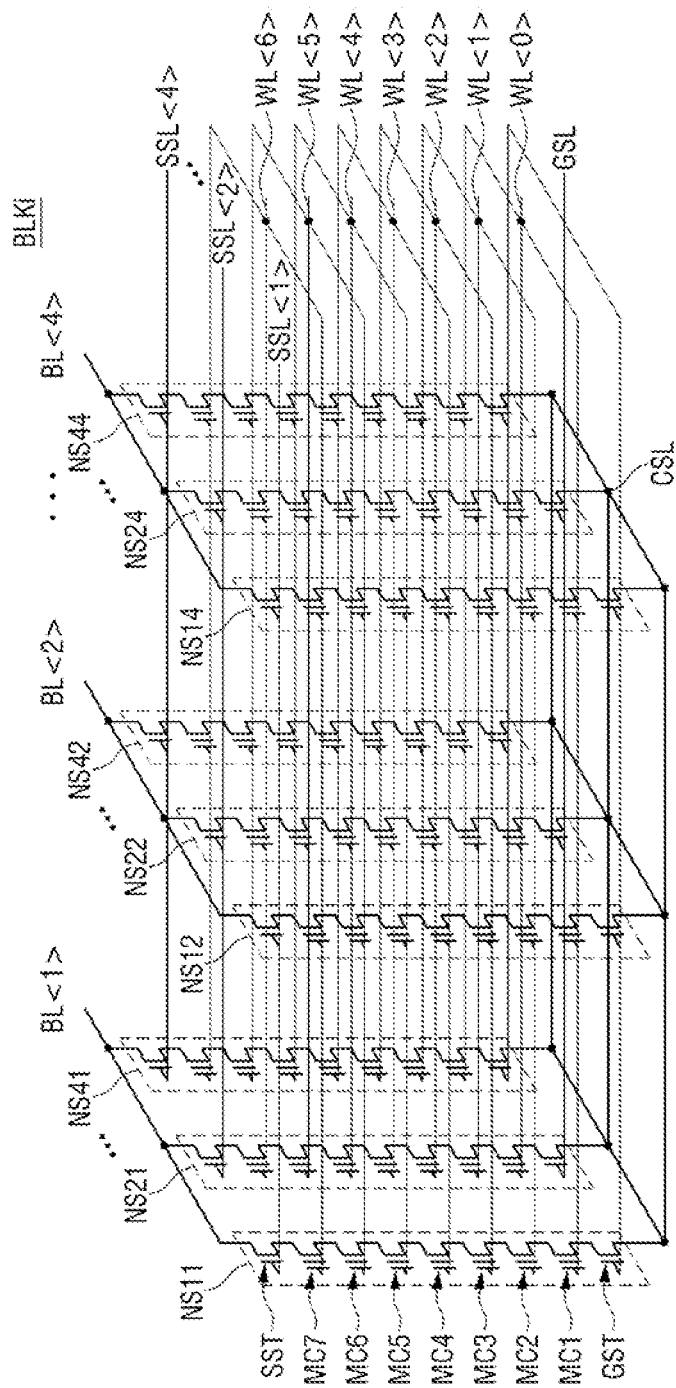
FIG. 2 is a circuit diagram of a first nonvolatile memory cell array of the storage device of FIG. 1.

FIG. 2 is a circuit diagram of the first nonvolatile memory cell array 110 of the storage device of FIG. 1.

Referring to FIG. 2, the first nonvolatile memory cell array 110 may be a three-dimensional (3D) memory cell array, but embodiments are not limited to this case. The first nonvolatile memory cell array 110 may also be a two-dimensional (2D) memory cell array.

In the 3D memory cell array, an array of memory cells may be monolithically formed at one or more physical levels, and circuitry related to the operation of the memory cells may also be included. The term "monolithic" denotes that layers at each level of an array are directly deposited on layers at each underlying level of the array. The 3D memory array may include a vertical NAND string which is vertically oriented such that at least one memory cell is located over other memory cells. The at least one memory cell may include a charge trap layer.

Specifically, cell strings NS11 through NS41 are provided between a first bit line BL<1> and a common source line CSL. Cell strings NS12 through NS42 are provided between a second bit line BL<2> and the common source line CSL. Cell strings NS14 through NS44 are provided between a fourth bit line BL<4> and the common source line CSL.

A string selection transistor SST of each cell string NS is connected to a corresponding bit line BL. A ground selection transistor GST of each cell string NS is connected to the common source line CSL. Memory cells MC1 through MC7 are provided between the string selection transistor SST and the ground selection transistor GST of each cell string NS.

Rows and columns of the cell strings NS are defined as follows.

The cell strings NS commonly connected to one bit line form one column. For example, the cell strings NS11 through NS41 connected to the first bit line BL<1> may correspond to a first column. The cell strings NS12 through NS42 connected to the second bit line BL<2> may correspond to a second column. The cell strings NS14 through NS44 connected to the fourth bit line BL<4> may correspond to a fourth column.

The cell strings NS connected to one string selection line SSL form one row. For example, the cell strings NS11 through NS14 connected to a first string selection line SSL<1> form a first row. The cell strings NS21 through NS24 connected to a second string selection line SSL<2> form a second row. The cell strings NS41 through NS44 connected to a fourth string selection line SSL<4> form a fourth row.

Each cell string NS includes the ground selection transistor GST. The ground selection transistors GST may be controlled by one ground selection line GSL. Alternatively, although not illustrated in the drawing, cell strings corresponding to each row may be controlled by a different ground selection line. For example, the respective ground selection transistors GST of the cell strings NS11, NS12, NS14 corresponding to the first row may be connected to a first ground selection line GSL1. In addition, the respective ground selection transistors GST of the cell strings NS21, NS22, NS24 corresponding to the second row may be connected to a second ground selection line GSL2. The respective ground selection transistors GST of the cell strings NS41, NS42, NS44 corresponding to the fourth row may be connected to a fourth ground selection line GSL4.

Memory cells corresponding to the same semiconductor layer share a word line (one of WL<0> through WL<6>).

The cell strings NS of the same row share a string selection line SSL. The cell strings NS of different rows are connected to different string selection lines SSL<1>, SSL<2>, SSL<4>, respectively. Hereinafter, first string selection transistors SST1 are defined as the string selection transistors SST connected to the first string selection line SSL<1>. Second string selection transistors SST2 are defined as the string selection transistors SST connected to the second string selection line SSL<2>. Fourth string selection transistors SST4 are defined as the string selection transistors SST connected to the fourth string selection line SSL<4>.

The common source line CSL is commonly connected to the cell strings NS.

The first nonvolatile memory cell array 110 may include a plurality of memory cell blocks BLKi. One memory block BLKi may be divided into segments, each composed of a plurality of strings sharing one string selection line SSL. That is, the memory block BLKi may be divided into sub-blocks SB, each composed of a plurality of cell strings sharing one string.

In addition, alternate programming may be applied in units of sub-blocks SB, each being smaller than one memory block BLKi. The cell strings NS11, NS12, NS14 sharing the first string selection line SSL<1> may be grouped into a first sub-block SB1. The cell strings NS21, NS22, NS24 sharing the second string selection line SSL<2> may be grouped into a second sub-block SB2. The cell strings NS41, NS42, NS44 sharing the fourth string selection line SSL<4> may be grouped into a fourth sub-block SB4. Although the nine cell strings are grouped into three sub-blocks, embodiments are not limited to this case. Alternatively, unlike the above description, alternate programming may be applied in units of memory blocks BLKi, each being a basic unit of erasing.

Figure 3:
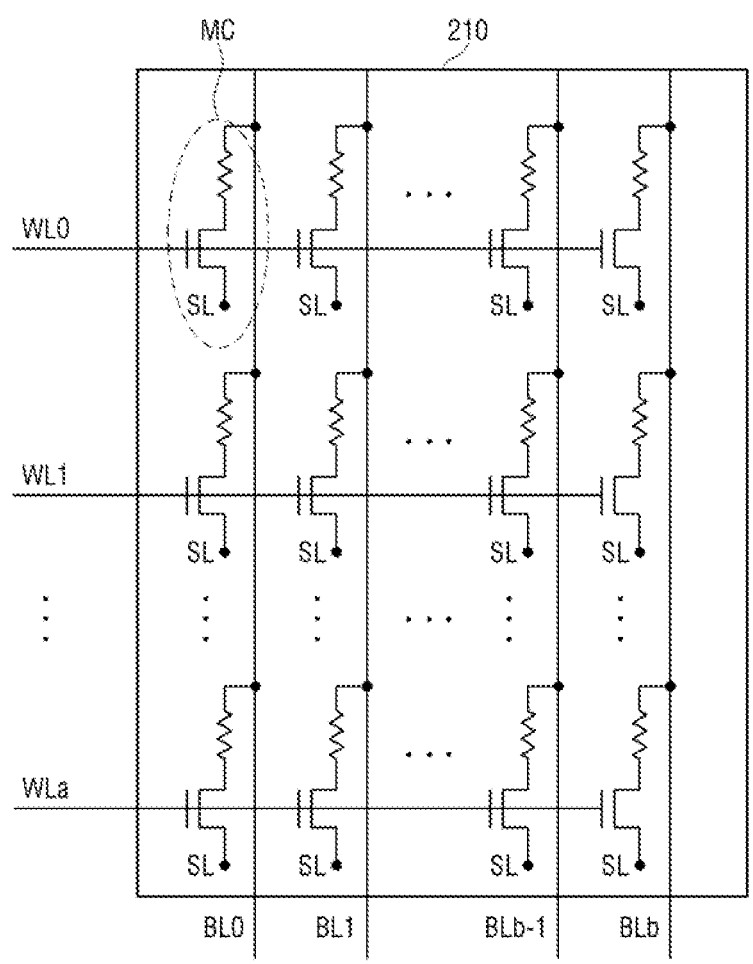
FIG. 3 is a circuit diagram of a second nonvolatile memory cell array of the storage device of FIG. 1.

FIG. 3 is a circuit diagram of the second nonvolatile memory cell array 210 of the storage device of FIG. 1.

Referring to FIG. 3, the second nonvolatile memory cell array 210 includes a plurality of word lines WL0 through WLa (where a is a natural number of 1 or more), a plurality of bit lines BL0 through BLb (where b is a natural number of 1 or more), and a plurality of memory cells MC disposed at intersections of the word lines WL0 through WLa and the bit lines BL0 through BLb. When the cell array 210 is implemented as a resistive memory, each of the memory cells MC may include a cell transistor and a resistive element. In addition, the cell transistor and the resistive element of each of the memory cells MC may be connected between any one of the bit lines BL0 through BLb and a source line SL. Although not clearly illustrated, a plurality of memory cells MC may be commonly connected to the same source line SL, but embodiments are not limited to this case. A row decoder selects the word lines WL0 through WLa to provide signals for turning on or off the cell transistors, and a column decoder selects the bit lines BL0 through BLb.

The resistive elements may be phase-change random access memories (PRAMs) using phase-change materials, resistive random access memories (RRAMs) using variable resistance materials such as complex metal oxide, or magnetic random access memories (MRAMs) using ferromagnetic materials. The materials that form the resistive elements may have resistance values that vary according to the magnitude and/or direction of a current or voltage and may have nonvolatile characteristics of maintaining the resistance values even if the current or voltage is interrupted.

Figure 4:
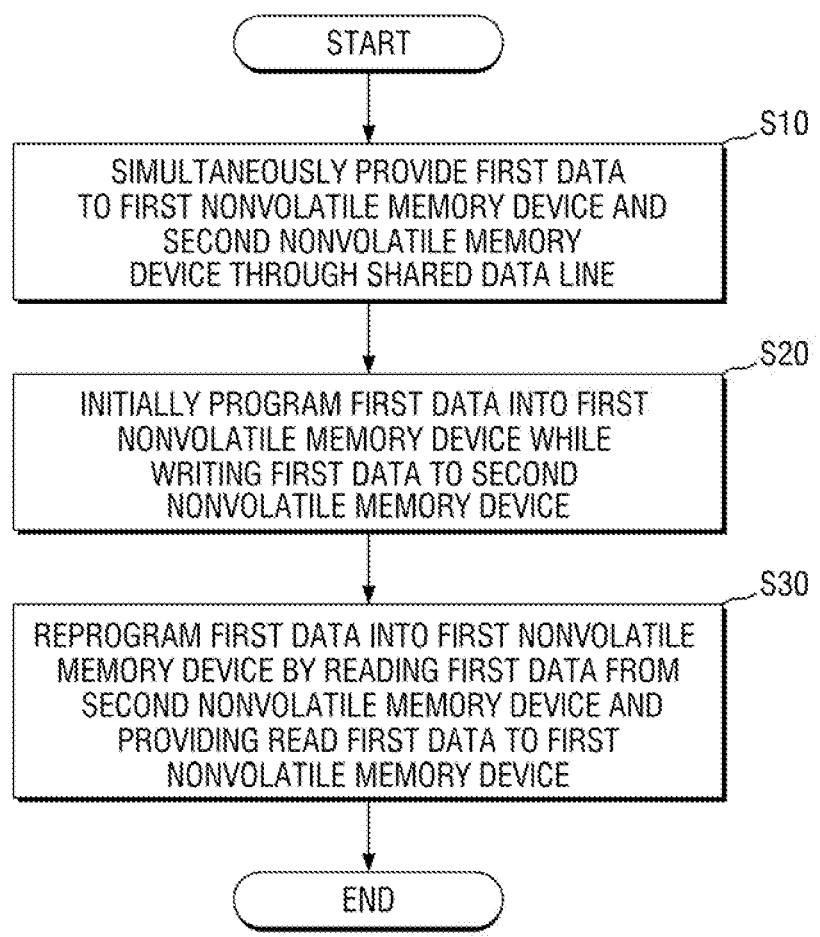
FIG. 4 is a flowchart illustrating an example of an operation of the storage device of FIGS. 1-3, according to an embodiment.
Figure 6:
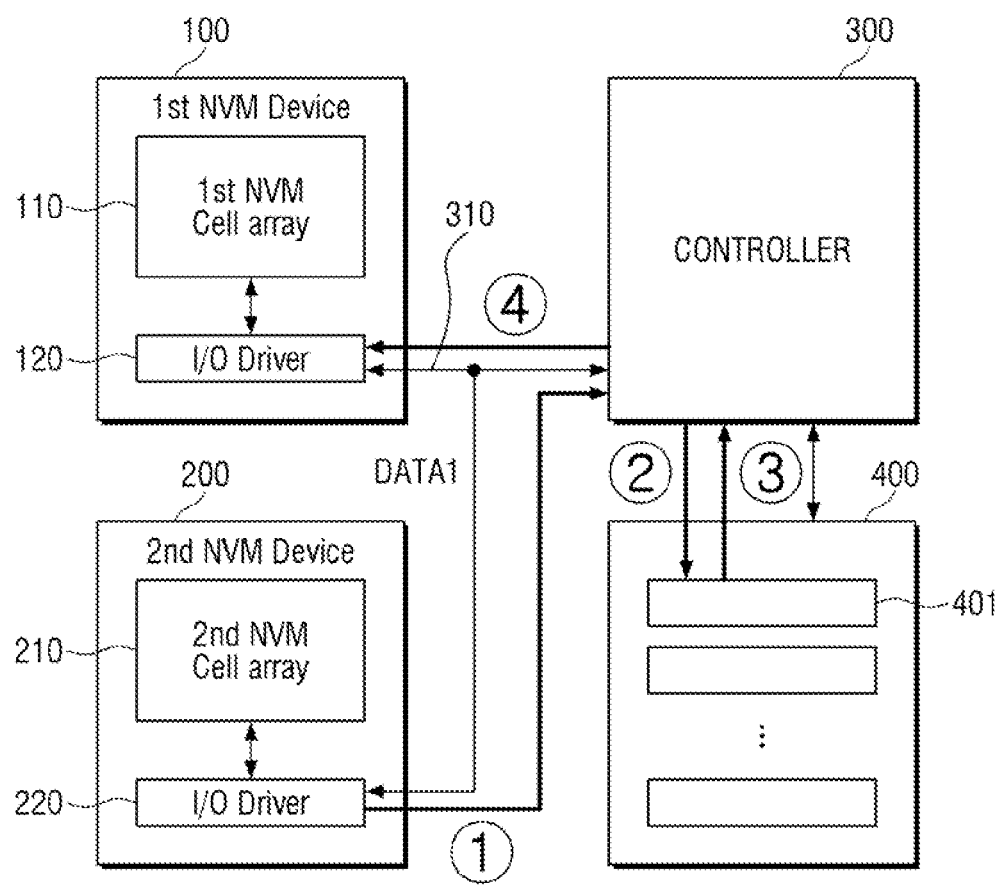
FIG. 6 is a conceptual diagram for explaining operation S30 of the flowchart of FIG. 4.

The operation of the storage device according to the embodiment illustrated in FIGS. 1-3 will now be described in detail with reference to FIGS. 4 through 6. FIG. 4 is a flowchart illustrating an example of the operation of the storage device according to an embodiment. FIG. 5 is a timing diagram for explaining operations S10 and S20 in the flowchart of FIG. 4. FIG. 6 is a conceptual diagram for explaining operation S30 in the flowchart of FIG. 4.

Referring to FIGS. 1 and 4, first data DATA1 to be programmed into the first nonvolatile memory device 100 is stored in the buffer memory 400.

Then, the first data DATA1 is simultaneously provided to the first nonvolatile memory device 100 and the second nonvolatile memory device 200 through the shared data line 310 (operation S10).

Specifically, referring to FIG. 5, NVM1 indicates the first nonvolatile memory device 100, NVM2 indicates the second nonvolatile memory device 200, and DQ indicates the data line. CE1 indicates a first chip selection signal for selecting the first nonvolatile memory device 100, and CE2 indicates a second chip selection signal for selecting the second nonvolatile memory device 200.

In a time section of t0 to t1, the first chip selection signal CE1 is activated. During this time, a program command PGM and a first address ADDR1 indicating a location in the first nonvolatile memory device 100 are provided to the first nonvolatile memory device 100 through the shared data line DQ.

In a time section of t1 to t2, the second chip selection signal CE2 is activated. During this time, a write command WR and a write address WADDR indicating a location in the second nonvolatile memory device 200 are provided to the second nonvolatile memory device 200 through the shared data line DQ.

In a time section of t2 to t3, the first chip selection signal CE1 and the second chip selection signal CE2 are activated. During this time, the first data DATA1 is provided through the shared data line DQ. Since the data line DQ is shared, the first data DATA1 is simultaneously provided to the first nonvolatile memory device 100 and the second nonvolatile memory device 200.

Referring again to FIGS. 1 and 4, the first data DATA1 is initially programmed into the first nonvolatile memory device 100 and is written to the second nonvolatile memory device 200 (operation S20).

Specifically, referring to FIG. 5, in a time section of t3 to t4, the first chip selection signal CE1 is activated. A program confirmation signal CF1 is provided to the first nonvolatile memory device 100. From time t4, the first data DATA1 is initially programmed into the first nonvolatile memory device 100.

In a time section of t4 to t5, the second chip selection signal CE2 is activated. A write confirmation signal CF2 is provided to the second nonvolatile memory device 200.

From time t5, the first data DATA1 is written to the second nonvolatile memory device 200.

As described above, an initial program period tPGM of the first nonvolatile memory device 100 and a write period tWR of the second nonvolatile memory device 200 may at least partially overlap with each other. The program time of the first nonvolatile memory device 100 may be longer than the write time of the second nonvolatile memory device 200 as described above. Therefore, since the initial program operation of the first nonvolatile memory device 100 starts first as illustrated in FIG. 5, the write operation of the second nonvolatile memory device 200 may be completed within the initial program period tPGM of the first nonvolatile memory device 100.

Referring again to FIGS. 1 and 4, the first data DATA1 is reprogrammed into the first nonvolatile memory device 100 by reading the first data DATA1 from the second nonvolatile memory device 200, and providing the first data DATA1 to the first nonvolatile memory device 100 (operation S30).

This case (i.e., a case where reprogramming is performed using the first data DATA1) may be a case where it is determined as a result of verification that the initial programming of the first data DATA1 into the first nonvolatile memory device 100 has failed. The data stored in the second nonvolatile memory 220 is used as backup data.

Specifically, referring to FIG. 6, if it is determined as a result of verification that the initial program operation has failed, the controller 300 may provide a read command/address to the second nonvolatile memory device 200 to read the first data DATA1 from the second nonvolatile memory device 200. Since the read speed of the second nonvolatile memory device 200 is faster than the read speed of the first nonvolatile memory device 100 as described above, the first data DATA1 may be read relatively quickly (see ①). The read first data DATA1 may be temporarily stored in a region (segment 401) of the buffer memory 400 (see ②). The controller 300 may retrieve the first data DATA1 from the buffer memory 400 (see ③) and may transfer the first data DATA1 to the first nonvolatile memory device 100 (see ④). Accordingly, the first data DATA1 may be reprogrammed.

Here, assume that the second nonvolatile memory device 200 does not exist. In this case, the first data DATA1 occupies the region 401 of the buffer memory 400 so as to be programmed into the first nonvolatile memory device 100. Then, the first data DATA1 is provided to the first nonvolatile memory device 100 and initially programmed into the first nonvolatile memory device 100. During the initial program operation, the buffer memory 400 cannot release (end) the occupation by the first data DATA1. If it is determined as a result of verification that the initial program operation has failed, the controller 300 retrieves the first data DATA1 from the buffer memory 400 and provides the first data DATA1 again to the first nonvolatile memory 100. Accordingly, the first data DATA1 is reprogrammed. If it is determined as a result of verifying the reprogram operation that the reprogram operation is successful, the memory 400 may finally release (end) the occupation by the first data DATA1. That is, the utilization of the buffer memory 400 is very low.

On the other hand, the storage device according to the embodiment illustrated in FIGS. 1-6 operates as follows, compared with the above example (a case where the second nonvolatile memory device 200 does not exist). First, the first data DATA1 occupies the region 401 of the buffer memory 400. The first data DATA1 is simultaneously provided to the first nonvolatile memory device 100 and the second nonvolatile memory device 200 through the shared data line 310. After the providing the first data DATA1, the buffer memory 400 releases (ends) the occupation by the first data DATA1. This is because the first data DATA1 may be read from the second nonvolatile memory device 200 and then used to reprogram the first nonvolatile memory device 100 when it is determined as a result of verification that the initial program operation has failed. That is, since the buffer memory 400 does not need to be occupied by the first data DATA1 until the programming of the first data DATA1 is completed (successful), the utilization of the buffer memory 400 may be increased.

Figure 7:
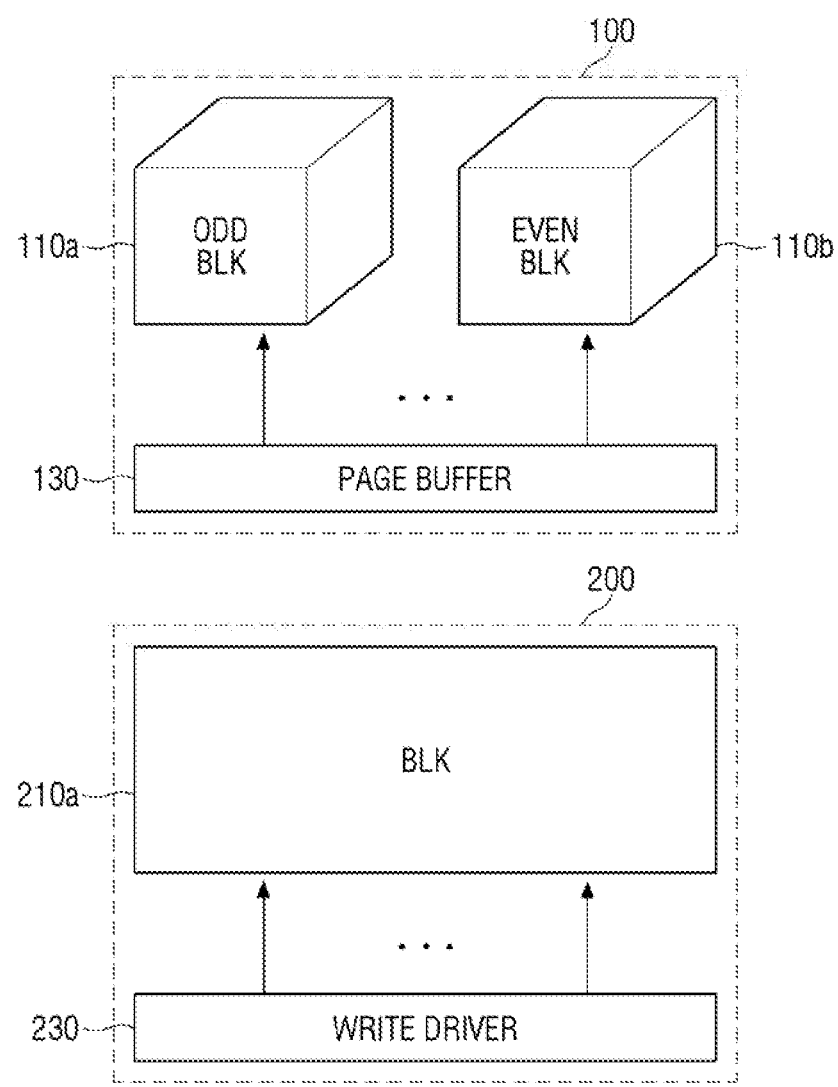
FIG. 7 is a block diagram of a storage device according to an embodiment.
Figure 8:
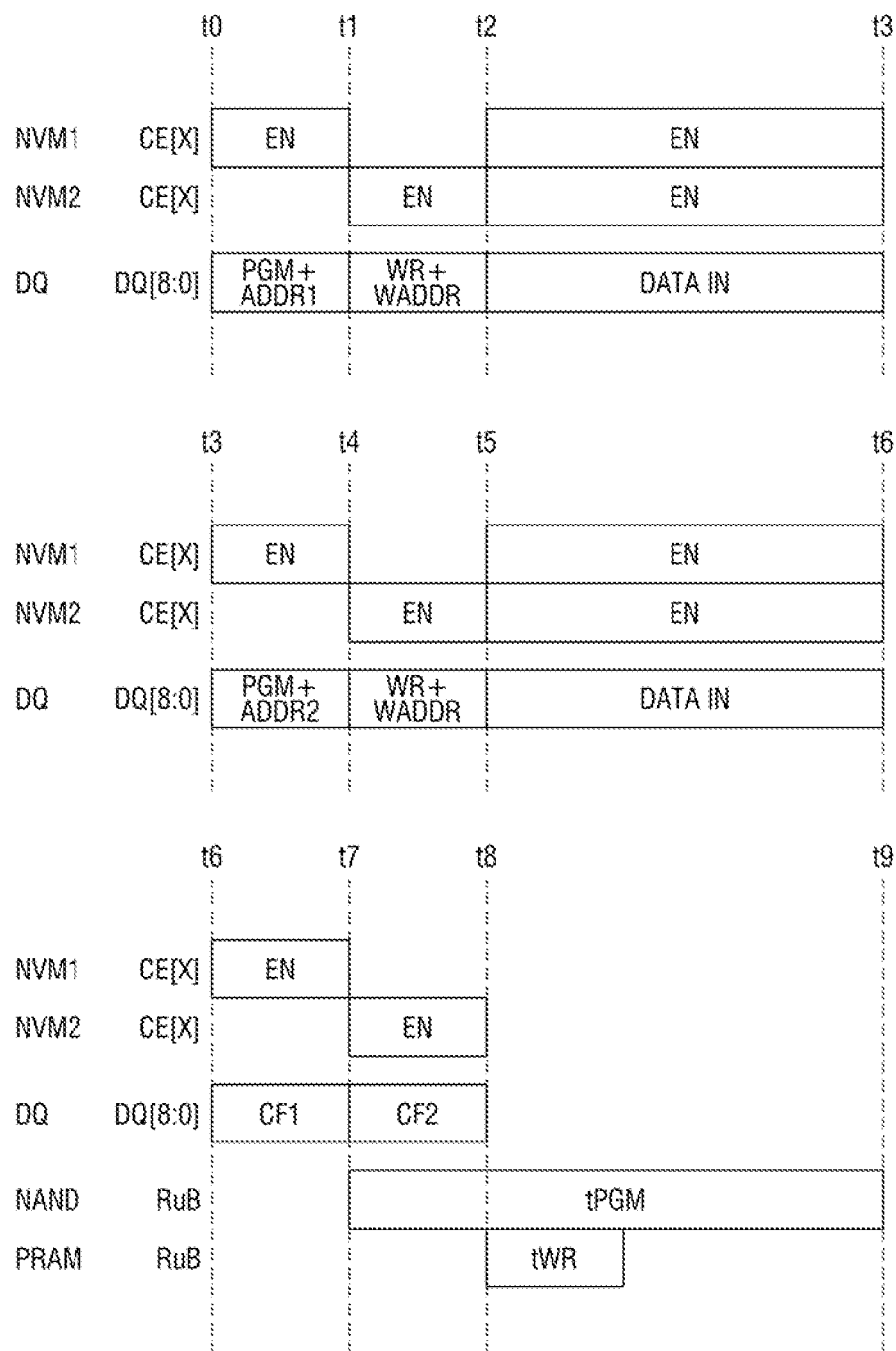
FIG. 8 is a timing diagram for explaining an example of an operation of the storage device of FIG. 7.

FIG. 7 is a block diagram of a storage device according to an embodiment. FIG. 8 is a timing diagram for explaining an example of the operation of the storage device of FIG. 7. For ease of description, differences from elements and features described with reference to FIGS. 1 through 6 will be mainly described below. A multi-phase program operation of the storage device will be described with reference to FIGS. 7 and 8.

First, referring to FIG. 7, a first nonvolatile memory cell array 110 of a first nonvolatile memory device 100 may include a plurality of memory cell blocks. For example, in some embodiments, the first nonvolatile memory cell array 110 may include an odd-numbered memory cell block 110a and an even-numbered memory cell block 110b. A second nonvolatile memory device 200 may include a memory cell block 210a.

The multi-phase program operation refers to simultaneously programming the memory cell blocks 110a and 110b spaced apart from each other. By simultaneously programming a plurality of memory cell blocks 110a and 110b, it is possible to reduce the program time. In FIG. 7, the odd-numbered memory cell block 110a and the even-numbered memory cell block 110b are simultaneously programmed.

Since the odd-numbered memory block 110a and the even-numbered memory cell block 110b are simultaneously programmed, the program operation starts after first data DATA1 for the odd-numbered memory cell block 110a and second data DATA2 for the even-numbered memory cell block 110b are provided to the first nonvolatile memory device 100.

Specifically, referring to FIG. 8, in a time section of t0 to t1, a first chip selection signal CE1 is activated. During this time, a program command PGM and a first address ADDR1 indicating a location in the first nonvolatile memory device 100 are provided through a shared data line DQ.

In a time section of t1 to t2, a second chip selection signal CE2 is activated. During this time, a write command WR and a first write address WADDR1 indicating a location in the second nonvolatile memory device 200 are provided through the shared data line DQ.

In a time section of t2 to t3, the first chip selection signal CE1 and the second chip selection signal CE2 are activated. During this time, the first data DATA1 is provided through the shared data line DQ. The first data DATA1 may be data to be programmed into the odd-numbered memory cell block 110a.

In a time section of t3 to t4, the first chip selection signal CE1 is activated. During this time, the program command PGM and a second address ADDR2 indicating a location in the first nonvolatile memory device 100 are provided through the shared data line DQ.

In a time section of t4 to t5, the second chip selection signal CE2 is activated. During this time, the write command WR and a second write address WADDR2 indicating a location in the second nonvolatile memory device 200 are provided through the shared data line DQ.

In a time section of t5 to t6, the first chip selection signal CE1 and the second chip selection signal CE2 are activated. During this time, the second data DATA2 is provided through the shared data line DQ. The second data DATA2 may be data to be programmed into the even-numbered memory cell block 110b.

In a time section of t6 to t7, the first chip selection signal CE1 is activated. A program confirmation signal CF1 is provided to the first nonvolatile memory device 100. From time t7, the first data DATA1 and the second data DATA2 are initially programmed into the first nonvolatile memory device 100. The first data DATA1 is programmed into the odd-numbered memory cell block 110a, and the second data DATA2 is programmed into the even-numbered memory cell block 110b.

In a time section of t7 to t8, the second chip selection signal CE2 is activated. A write confirmation signal CF2 is provided to the second nonvolatile memory device 200. From time t8, the first data DATA1 and the second data DATA2 are written to the second nonvolatile memory device 200.

A program period tPGM of the first nonvolatile memory device 100 and a write period tWR of the second nonvolatile memory device 200 may at least partially overlap with each other.

Unlike the above description with reference to FIGS. 7-8, in some embodiments, the second data DATA2 may be programmed into the odd-numbered memory cell block 110a, and the first data DATA1 may be programmed into the even-numbered memory cell block 110b.

As described above with reference to FIGS. 7 and 8, in the multi-phase program operation, the data DATA1 and DATA2 for the odd-numbered memory cell block 110a and the even-numbered memory cell block 110b respectively, may be provided to the first nonvolatile memory device 100. Thus, a data transfer time (i.e., a time period of t0 to t6) may inevitably be longer than a case such as described with reference to FIGS. 1-6.

Here, if two or more bits are stored in one memory cell, the data transfer time increases. If the first nonvolatile memory device 100 includes multi-level cells (MLCs), the data transfer time becomes twice the time period of t0 to t6. If the first nonvolatile memory device 100 includes triple-level cells (TLCs), the data transfer time becomes three times the time period of t0 to t6. If the first nonvolatile memory device 100 includes quadruple-level cells (QLCs), the data transfer time becomes four times the time period of t0 to t6.

Assuming a case in which the second memory device 200 is not used as a backup memory, a buffer memory (e.g., an SRAM) is occupied for the increased data transfer time. In addition, the buffer memory is continuously occupied until the completion of programming. Further, if two or more bits are stored in one memory cell, the utilization of the buffer memory is significantly reduced.

However, the storage device according to the embodiment illustrated in FIGS. 7-8 ends the occupation of the buffer memory 400 by data after transmitting the data to the first nonvolatile memory device 100 and the second nonvolatile memory device 200 through a shared data line 310. The occupation of the buffer memory 400 by the data can also be released (ended) before the data is written to the second nonvolatile memory device 200. Therefore, even if two or more bits are stored in one memory cell and/or the multi-phase operation is performed, the utilization of the buffer memory 400 may be increased.

Figure 9:
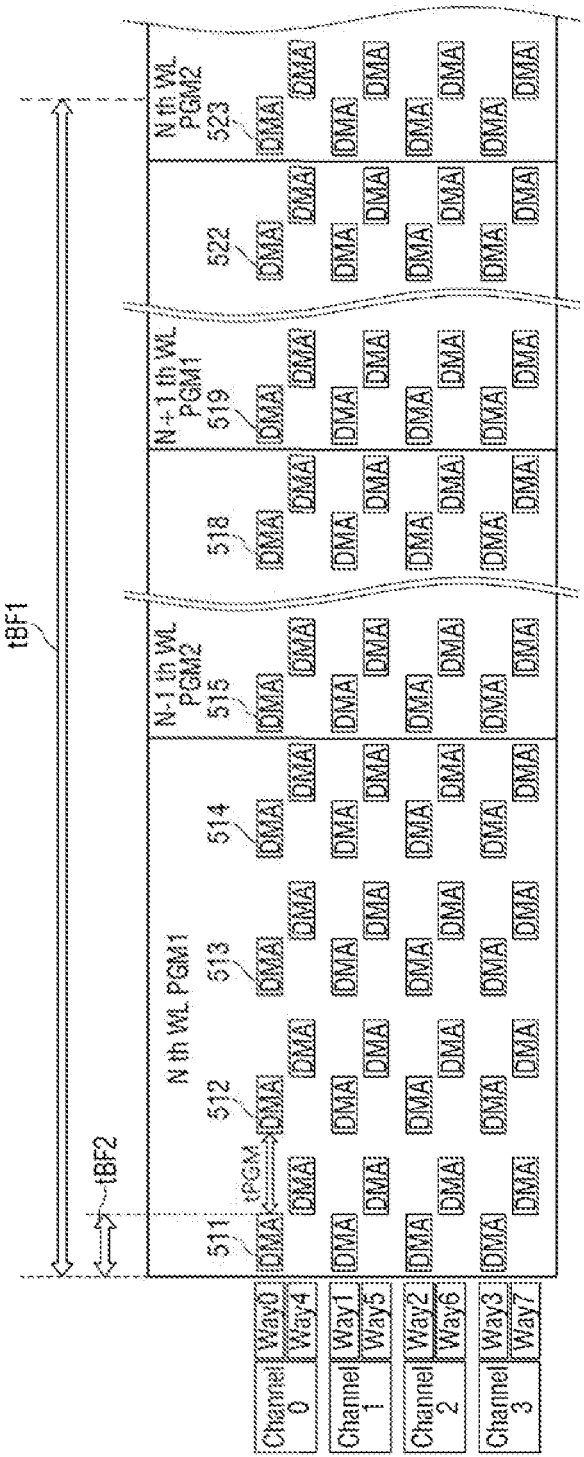
FIG. 9 is a timing diagram for explaining an example of an operation of a storage device according to an embodiment.

FIG. 9 is a timing diagram for explaining an example of the operation of a storage device according to an embodiment. For ease of description, differences from elements and features described using FIGS. 1 through 8 will be mainly described below.

A case where a first nonvolatile memory device 100 is a NAND flash memory device employing a reprogram method and an alternate program method will be described as an example with reference to FIG. 9. The NAND flash memory device may include TLCs or QLCs, each storing three or more bits. When three or more bits are stored in one memory cell, the same data may be programmed two or more times in order for programming accuracy/stability. This is denoted the reprogram method.

A sequential program method denotes programming memory cells connected to a first word line and then programming memory cells connected to a next word line (second word line). On the other hand, the alternate program method refers to alternately programming some memory cells of the second word line, some memory cells of a previous word line (first word line), and/or some memory cells of a next word line (third word line) in a preset order. That is, memory cells connected to adjacent word lines are alternately programmed.

In addition, referring to FIG. 9, each of channels Channel0 through Channel3 refers to an independent data path existing between one cluster (or group) and a controller 300. The data path may include transmission lines through which data and/or commands are transmitted. Each of ways Way0 through Way7 may refer to a cluster (or group) of one or more nonvolatile memory devices sharing one channel. For example, the ways Way0 and Way4 share the channel Channel0. DMA in FIG. 9 indicates a data transfer time.

As illustrated in FIG. 9, an initial program operation Nth WL PGM1 of an $N^{th}$ word line, a reprogram operation N−1th WL PGM2 of an $(N-1)^{th}$ word line, an initial program operation N+1th WL PGM1 of an $(N+1)^{th}$ word line, and a reprogram operation $N^{th}$ WL PGM2 of the $N^{th}$ word line are sequentially performed.

The programming of each word line may be performed, for example, on a sub-block-by-sub-block basis. For example, if the $N^{th}$ word line is divided into four sub-blocks, four data transfer operations and four program operations may be performed. That is, the initial program operation $N^{th}$ WL PGM1 of the $N^{th}$ word line includes a data transfer time 511 corresponding to a first sub-block, a program time tPGM of the first sub-block, a data transfer time 512 corresponding to a second sub-block, a program time of the second sub-block, a data transfer time 513 corresponding to a third sub-block, a program time of the third sub-block, a data transfer time 514 corresponding to a fourth sub-block, and a program time of the fourth sub-block. It is noted that only program time tPGM between data transfer time 511 and data transfer time 512 is shown in FIG. 9 for convenience of explanation. That is, for example, there is another program time tPGM between data transfer time 512 and data transfer time 513, and so forth.

Likewise, the reprogram operation N−1th WL PGM2 of the $(N-1)^{th}$ word line includes four data transfer operations 515 through 518 and four program operations (with corresponding program times).

The initial program operation N+1th WL PGM1 of the $(N+1)^{th}$ word line includes four data transfer operations 519 through 522 and four program operations (with corresponding program times).

Then, the reprogram operation Nth WL PGM2 of the $N^{th}$ word line is performed. In the reprogram operation Nth WL PGM2 of the $N^{th}$ word line, a data transfer time 523 corresponding to the first sub-block and the program time tPGM of the first sub-block are started. Data transferred during the data transfer time 511 and the data transfer time 523 is data to be programmed into the same sub-block.

In summary, as illustrated in FIG. 9, a period tBF1 between the initial programming of the first sub-block of the $N^{th}$ word line and the reprogramming of the first sub-block of the $N^{th}$ word line is quite long (see 511 and 523). This is because programming sub-blocks connected to the $(N-1)^{th}$ word line and/or the $(N+1)^{th}$ word line is placed between the initial programming of the first sub-block of the $N^{th}$ word line and the reprogramming of the first sub block of the $N^{th}$ word line.

Here, assuming a second nonvolatile memory device 200 is not used as a backup memory, data to be programmed into the first sub-block of the $N^{th}$ word line occupies a buffer memory 400 for a very long period tBF1.

However, in the storage device according to the embodiments, the controller 300 releases (ends) the occupation of the buffer memory 400 by the data to be programmed into the first sub-block of the $N^{th}$ word line after providing the data to the first nonvolatile memory device 100 (that is, see 511). That is, the data to be programmed into the first sub-block of the $N^{th}$ word line occupies the buffer memory 400 only for a very short period tBF2. Therefore, the utilization of the buffer memory 400 may be increased.

Figure 10:
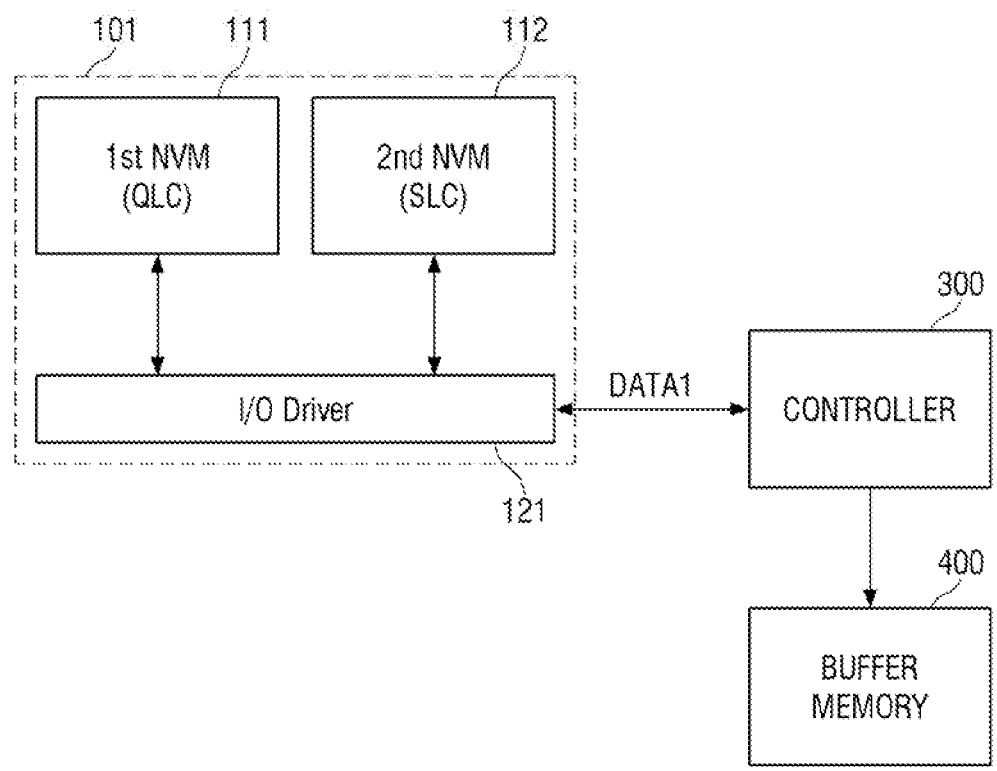
FIG. 10 is a block diagram of a storage device according to an embodiment.

FIG. 10 is a block diagram of a storage device according to an embodiment. For ease of description, differences from elements and features described using FIGS. 1 through 9 will be mainly described below.

Referring to FIG. 10, a first nonvolatile memory device 111 may be a flash memory device (e.g., a TLC memory device or a QLC memory device) that may store a plurality of bits in one memory cell, and a second nonvolatile memory device 112 may be a flash memory device (e.g., an SLC memory device) that may store one bit in one memory cell. That is, the first nonvolatile memory device 111 may have n-level memory cells (where n is a natural number), and the second nonvolatile memory device 112 may have m-level memory cells (where m is a natural number), and n>m. For example, if the first nonvolatile memory device 111 is a QLC and the second nonvolatile memory device 112 is an SLC, four bits are stored in one QLC and in four SLCs. A controller 300 may generate an address by taking this into consideration.

As illustrated in the drawing, the first nonvolatile memory device 111 and the second nonvolatile memory device 112 may be merged into one apparatus 101, but embodiments are not limited to this case. An input/output driver 121 may simultaneously program data to the first nonvolatile memory device 111 and the second nonvolatile memory device 112. Alternatively, in some embodiments, the first nonvolatile memory device 111 and the second nonvolatile memory device 112 may be physically separated from each other.

Figure 11:
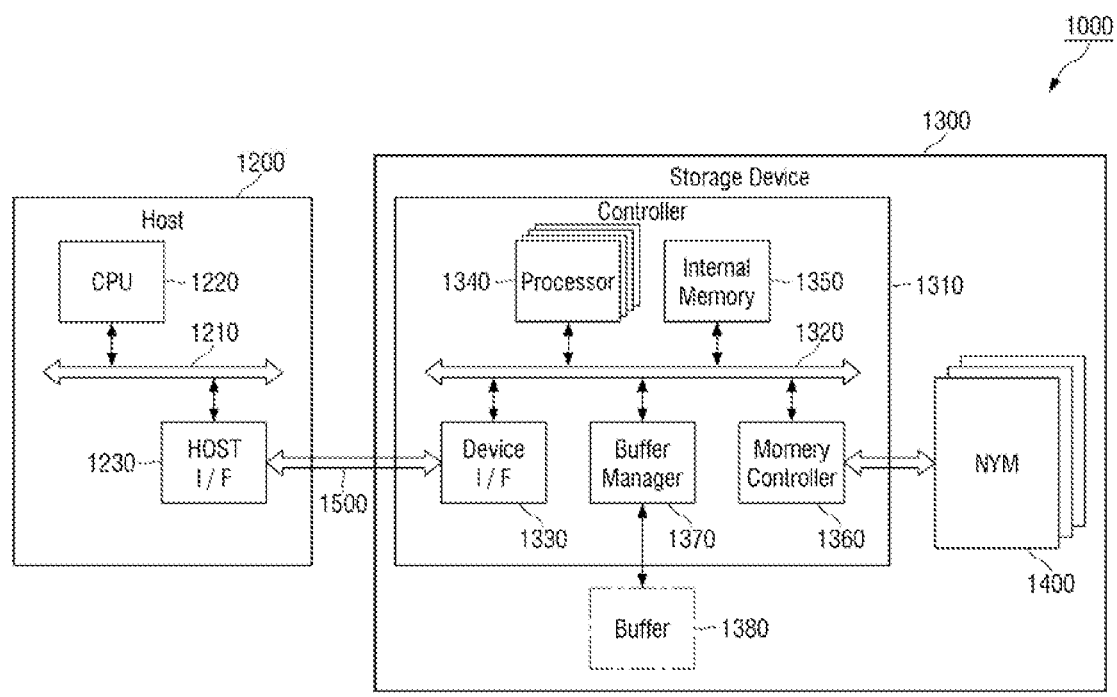
FIG. 11 is a block diagram of a storage device according to an embodiment.

FIG. 11 is a block diagram of a storage device according to an embodiment.

Referring to FIG. 11, a storage device 1300 may be applied to a data processing system 1000, and the storage device 1300 and a host 1200 are connected to and communicate with each other through an interface 1500.

According to embodiments, the data processing system 1000 may be implemented as a personal computer (PC), a desktop computer, a laptop computer, a workstation computer, or a mobile computing device.

The mobile computing device may be implemented as a mobile phone, a smartphone, a tablet PC, a personal digital assistant (PDA), an enterprise digital assistant (EDA), a digital still camera, a digital video camera, a portable multimedia player (PMP), a multimedia device, a personal or portable navigation device (PND), a handheld game console, a mobile Internet device (MID), a wearable device (or a wearable computer), an Internet of things (IoT) device, an Internet of everything (IoE) device, or an electronic book (e-book).

The interface 1500 may be implemented as, but is not limited to, a serial advanced technology attachment (SATA) interface, an SATA express (SATAe) interface, a serial attached small computer system interface (SCSI), a peripheral component interconnect express (PCIe) interface, a nonvolatile memory express (NVMe) interface, an advanced host controller interface (AHCI), a NAND-type flash memory interface, or a multimedia card (MMC) interface. According to embodiments, the interface 1500 may transmit electrical signals or optical signals.

The host 1200 may control a data processing operation (e.g., a write operation (or a program operation) or a read operation) of the storage device 1300 through the interface 1500. For example, the host 1200 may be a host controller.

According to an embodiment, the host 1200 may be implemented as an integrated circuit (IC), a mother board, an application processor (AP), a mobile AP, or a system on chip (SoC).

A central processing unit (CPU) 1220 and a host interface (I/F) 1230 may exchange commands and/or data with each other through a bus structure 1210.

The bus structure 1210 may be implemented as, but is not limited to, an advanced microcontroller bus architecture (AMBA), an advanced high-performance bus (AHB), an advanced peripheral bus (APB), an advanced extensible interface (AXI), an advanced system bus (ASB), or a combination of the same.

The CPU 1220 may generate a write request for controlling a write operation of the storage device 1300 or a read request for controlling a read operation of the storage device 1300. The write request may include a write address, and the read request may include a read address. For example, the CPU 1220 may include one or more cores. A request may denote a command.

The host interface 1230 may change the format of a command and/or data to be transmitted to the storage device 1300 and transmit the changed command and/or data to the storage device 1300 through the interface 1500. In addition, the host interface 1230 may change the format of a response and/or data received from the storage device 1300 and transmit the changed response and/or data to the CPU 1220 through the bus structure 1210. According to an embodiment, the host interface 1230 may include a transceiver capable of transmitting and receiving commands and/or data. The structure and operation of the host interface 1230 may be implemented suitable for the structure and operation of the interface 1500.

The storage device 1300 may include a controller 1310 and nonvolatile memories (NVMs) 1400. According to embodiments, the storage device 1300 may further include a buffer 1380.

The storage device 1300 may correspond to the storage device according to embodiments described above with reference to FIGS. 1 through 10. The storage device 1300 may store data output from the host 1200 to the nonvolatile memories 1400 under the control of the controller 1310.

The storage device 1300 may be implemented as, but is not limited to, a flash memory-based memory device. For example, the storage device 1300 may be implemented as, but is not limited to, a smart card, a secure digital (SD) card, a multimedia card (MMC), an embedded MMC (eMMC), an embedded multi-chip package (eMCP), a perfect page NAND (PPN), a universal flash storage (UFS), a universal serial bus (USB) flash drive, a solid state drive (SSD), or an embedded SSD (eSSD).

The controller 1310 may control commands and/or data exchanged between the host 1200 and the nonvolatile memories 1400. According to embodiments, the controller 1310 may be implemented as an IC or a SoC. The controller 1310 may include a bus structure 1320, a device interface (I/F) 1330, processors 1340, an internal memory 1350, a memory controller 1360, and a buffer manager 1370.

The bus structure 1320 may be implemented as, but is not limited to, an AMBA, an AHB, an APB, an AXI, an ASB, or a combination of the same.

The device interface 1330 may change the format of a response and/or data to be transmitted to the host 1200 and transmit the changed response and/or data to the host 1200 through the interface 1500. In addition, the device interface 1330 may receive a command and/or data transmitted from the host 1200, change the format of the received command and/or data, and transmit the changed command and/or data to the processors 1340 and/or the buffer manager 1370. According to an embodiment, the device interface 1330 may include a transceiver that can transmit and receive signals and/or data. The structure and operation of the device interface 1320 may be implemented suitable for the structure and operation of the interface 1500.

The processors 1340 may control the device interface 1330, the internal memory 1350, the memory controller 1360, and the buffer manager 1370 through the bus structure 1320. The processors 1340 may execute firmware (or computer program) that can control the operation of the storage device 1300. According to embodiments, the controller 1310 may include processors for processing commands and/or data output from the host 1200 and processors for controlling access operations to the nonvolatile memories 1400, for example, write operations, read operations and/or erase operations.

The internal memory 1350 may store data used for the operation of the controller 1310 or data generated by a data processing operation (e.g., a write operation or a read operation) performed by the controller 1310. According to embodiments, the internal memory 1350 may be implemented as a random access memory (RAM), a DRAM, an SRAM, a buffer, a buffer memory, a cache, or a tightly coupled memory (TCM).

The internal memory 1350 may store a flash translation layer (FTL) loaded from at least one of the nonvolatile memories 1400. The FTL may denote firmware for performing address mapping for mapping a logical address output from the host 1200 to physical addresses of the nonvolatile memories 1400, wear-leveling, and/or garbage collection.

The memory controller 1360 may control data processing operations (e.g., write operations, read operations, and/or erase operations) performed on the nonvolatile memories 1400 under the control of the processors 1340. For example, when the nonvolatile memories 1400 are implemented as flash memories, the memory controller 1360 may function as a flash memory controller. The memory controller 1360 and the nonvolatile memories 1400 may exchange control signals and/or data through channels.

The memory controller 1360 may control garbage collection performed on data blocks included in the nonvolatile memories 1400. According to embodiments, the memory controller 1360 may manage mapping table information of data blocks related to the garbage collection.

According to embodiments, the memory controller 1360 may support an SATA interface, an SATAe interface, an SAS, a PCIe interface, an NVMe interface, an AHCI, an MMC interface, a NAND-type flash memory interface, or a NOR-type flash memory interface.

The buffer manager 1370 may write data to the buffer 1380 or read data from the buffer 1380. According to embodiments, the buffer 1380 may be implemented as a RAM, an SRAM, or a DRAM.

The buffer 1380 may store a mapping table for logical address-physical address translation for the nonvolatile memories 1400 and a bitmap related to mapping table information of each data block included in the nonvolatile memories 1400. The bitmap may include the number of mapping tables and index information for a corresponding data block. The mapping table and the bitmap may be updated by the FTL.

The buffer 1380 may also function as a cache that temporarily stores write data to be transmitted to the nonvolatile memories 1400.

Here, the controller 1310 and the buffer 1380 may correspond to the controller 300 and the buffer memory 400 according to embodiments described above with reference to FIGS. 1 through 10.

According to embodiments, when the controller 1310 and the buffer 1380 are implemented as different semiconductor chips, the controller 1310 and the buffer 1380 may be implemented as one package, for example, a package-on-package (PoP), a multi-chip package (MCP), or a system-in package (SiP).

The nonvolatile memories 1400 may store an operating system (OS), various programs, and various data. Each of the nonvolatile memories 1400 may include at least one memory cell array. Each of the nonvolatile memories 1400 may be implemented as a semiconductor chip or a semiconductor package. At least one panel may be disposed (or formed) between the memory controller 1360 and the nonvolatile memories 1400. The channel may include transmission lines for transmitting commands and/or data. According to embodiments, the nonvolatile memories 1400 may be implemented as A channels×B ways. Here, A and B may each be a natural number of 1 or more.

Here, one or more of the nonvolatile memories 1400 may correspond to the first nonvolatile memory device 100 and the second nonvolatile memory device 200 according to embodiments described above with reference to FIGS. 1 through 10.

Although exemplary embodiments have been discussed with reference to accompanying figures, it will be understood that various changes in form and details may be made therein without departing from the spirit and scope of the embodiments. It therefore will be understood that the embodiments described above are just illustrative but not limitative in all aspects, the scope being defined by the appended claims.

What is claimed is:
1. A storage device comprising:
   a first nonvolatile memory device;
   a second nonvolatile memory device which is of a different type from the first nonvolatile memory device; and a data line which is shared by the first nonvolatile memory device and the second nonvolatile memory device, wherein first data is simultaneously provided to the first nonvolatile memory device and the second nonvolatile memory device through the data line, the first data is written to the second nonvolatile memory device, and the first data is reprogrammed into the first nonvolatile memory device by reading the first data from the second nonvolatile memory device and providing the read first data to the first nonvolatile memory device.

2. The storage device of claim 1, further comprising a buffer memory, wherein the first data occupies a first region of the buffer memory, and an occupation of the first region by the first data ends after the first data is simultaneously provided to the first nonvolatile memory device and the second nonvolatile memory device.

3. The storage device of claim 2, wherein the occupation of the first region by the first data ends before the first data is written to the second nonvolatile memory device.

4. The storage device of claim 1, wherein the first data is initially programmed into the first nonvolatile memory device before being reprogrammed into the first nonvolatile memory device, wherein an initial program period of the first nonvolatile memory device at least partially overlaps a write period of the second nonvolatile memory device.

5. The storage device of claim 4, wherein the first data is reprogrammed into the first nonvolatile memory device if it is determined as a result of verification that the initial programming of the first data into the first nonvolatile memory device has failed.

6. The storage device of claim 4, wherein the first nonvolatile memory device is a NAND flash device capable of storing three or more bits.

7. The storage device of claim 4, wherein the first data is programmed into memory cells connected to an N-th word line in the initial programming and the reprogramming, and wherein programming memory cells connected to an (N+1)-th word line or an (N−1)-th word line is further performed between the initial programming and the reprogramming, wherein N is a natural number greater than 2.

8. The storage device of claim 1, wherein a program command and a first address are provided to the first nonvolatile memory device in a first time section, a write command and a second address are provided to the second nonvolatile memory device in a second time section different from the first time section, and the first data is simultaneously provided to the first nonvolatile memory device and the second nonvolatile memory device in a third time section after the first time section and the second time section.

9. The storage device of claim 8, wherein the first data is initially programmed into the first nonvolatile memory device and is written to the second nonvolatile memory device after the third time section, and wherein an initial program period of the first nonvolatile memory device at least partially overlaps with a write period of the second nonvolatile memory device.

10. The storage device of claim 8, wherein a program command and a third address are provided to the first nonvolatile memory device in a fourth time section after the third time section, a write command and a fourth address are provided to the second nonvolatile memory device in a fifth time section different from the fourth time section, and second data is simultaneously provided to the first nonvolatile memory device and the second nonvolatile memory device in a sixth time section after the fourth time section and the fifth time section, wherein the first address corresponds to one of odd-numbered memory blocks or even-numbered memory blocks of the first nonvolatile memory device, and the third address corresponds to the other one of the odd-numbered memory blocks or the even-numbered memory blocks of the first nonvolatile memory device.

11. The storage device of claim 10, wherein the first data is initially programmed into one of the odd-numbered memory blocks or the even-numbered memory blocks of the first nonvolatile memory device after the sixth time section, the second data is initially programmed into the other one of the odd-numbered memory blocks or the even-numbered memory blocks of the first nonvolatile memory device, and the first data and the second data are written to the second nonvolatile memory device, wherein an initial program period of the first nonvolatile memory device at least partially overlaps with a write period of the second nonvolatile memory device.

12. The storage device of claim 1, wherein a read speed of the second nonvolatile memory device is faster than a read speed of the first nonvolatile memory device.

13. The storage device of claim 1, wherein the first nonvolatile memory device is a NAND flash memory device, and the second nonvolatile memory device is a phase-change memory device.

14. The storage device of claim 1, wherein the first nonvolatile memory device is a NAND flash memory device capable of storing n bits, and the second nonvolatile memory device is a NAND flash memory device capable of storing m bits, wherein n is a natural number of 2 or more, and m is a natural number smaller than n.

15. A storage device comprising:
a NAND flash memory device;
a phase-change memory device; and
a data line which is shared by the NAND flash memory device and the phase-change memory device, wherein first data is simultaneously provided to the NAND flash memory device and the phase-change memory device through the data line, and the first data is initially programmed into the NAND flash memory device while being written to the phase-change memory device, and wherein an initial program period of the NAND flash memory device at least partially overlaps with a write period of the phase-change memory device.

16. The storage device of claim 15, wherein if it is determined as a result of verification that the initial programming has failed, the first data is reprogrammed into the NAND flash memory device by reading the first data from the phase-change memory device and providing the read first data to the NAND flash memory device.

17. The storage device of claim 15, wherein the NAND flash memory device is capable of storing three or more bits, and, after the initial programming, the first data is reprogrammed into the NAND flash memory device by reading the first data from the phase-change memory device and providing the read first data to the NAND flash memory device.

18. The storage device of claim 17, wherein the first data is programmed into memory cells connected to an N-th word line in the initial programming and the reprogramming, and wherein programming memory cells connected to an (N+1)-th word line or an (N−1)-th word line is further performed between the initial programming and the reprogramming, wherein N is a natural number greater than 2.

19. The storage device of claim 15, wherein a program command and a first address are provided to the NAND flash memory device in a first time section, a write command and a second address are provided to the phase-change memory device in a second time section different from the first time section, and the first data is simultaneously provided to the NAND flash memory device and the phase-change memory device in a third time section after the first time section and the second time section.

20. A storage device comprising:
 a first nonvolatile memory device;
 a second nonvolatile memory device which is of a different type from the first nonvolatile memory device;
 a data line which is shared by the first nonvolatile memory device and the second nonvolatile memory device; and
 a buffer memory,
 wherein first data occupies a first region of the buffer memory, an occupation of the first region by the first data ends after the first data of the buffer memory is simultaneously provided to the first nonvolatile memory device and the second nonvolatile memory device through the data line, and
 wherein the first data is written to the second nonvolatile memory device while being initially programmed into the first nonvolatile memory device.

* * * * *